(12) United States Patent
Kim et al.

(10) Patent No.: US 6,475,857 B1
(45) Date of Patent: Nov. 5, 2002

(54) METHOD OF MAKING A SCALABLE TWO TRANSISTOR MEMORY DEVICE

(75) Inventors: Woosik Kim, Suwon (KR); Seungheon Song, Sungnam (KR); Hokyu Kang, Sungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/884,912

(22) Filed: Jun. 21, 2001

(51) Int. Cl.[7] ..................... H01L 21/00; H01L 21/8247
(52) U.S. Cl. ........................ 438/240; 438/258
(58) Field of Search ................... 438/238–266

(56) References Cited

U.S. PATENT DOCUMENTS

| | | | |
|---|---|---|---|
| 5,723,375 A | * | 3/1998 | Ma et al. .................. 438/241 |
| 5,952,692 A | | 9/1999 | Nakazato et al. |
| 6,040,217 A | * | 3/2000 | Lin et al. .................. 438/241 |

OTHER PUBLICATIONS

Nakazato et al, "PLED–Plannar Localised Electron Devices", IEDM 97, pp. 179–182 [©1997 IEEE] .

* cited by examiner

Primary Examiner—Richard Booth
(74) Attorney, Agent, or Firm—Lee & Sterba, P.C.

(57) ABSTRACT

A method of fabricating a multiple tunnel junction Scalable Two-Transistor Memory (STTM) cell array with a unit cell area as low as $4F^2$, F representing the minimum feature dimension, which usually is the width and also the spacing of the data lines or the write (or word or control gate) lines, wherein process sequence and conditions are designed to offer wide flexibility in material choices and layer thickness at different regions of the STTM cell with surface planarity maintained at several stages of the manufacturing sequence. The processing of memory cell devices is made compatible with peripheral CMOS devices so that the devices in both areas can be made simultaneously, thereby decreasing the total number of processing steps. Insulator filled trenches around the device regions, source/drain and the gate regions of the peripheral devices are formed simultaneously with the corresponding regions of the memory cell devices.

61 Claims, 9 Drawing Sheets

METHOD OF MAKING A SCALABLE TWO TRANSISTOR MEMORY DEVICE

BACKGROUND OF THE INVENTION

1. Field of the Invention

The present invention pertains in general to semiconductor devices, and more particularly to the manufacturing of a planar small dimensional memory cell array and its peripheral circuitry.

2. Description of Related Art

DRAM semiconductor devices have an advantage of a possible higher integration density as compared to other memory devices such as SRAM semiconductor devices, but DRAM semiconductor devices cannot maintain a decreasing stored charge, as required by scaling, due to leakage current from memory cells, internal noise, and soft errors caused by incident alpha particles. Therefore, the memory cells of such devices require constant refreshing in order to maintain data stored in the memory cells. Thus, power consumption is large even in stand-by mode.

Flash memory devices or EEPROM devices, on the other hand, have a merit in that there is no need to refresh the memory cells in order to maintain data stored in the memory cells. However, a primary drawback of flash memory devices is that it is difficult to improve its relative slow access time because it takes a relatively long time to program the memory cells. Moreover, a high voltage is necessary to program (write) or erase memory cells of flash memory devices. The high electric field applied during erase/write cycles degrades the $SiO_2$ tunneling barrier to the floating gate over a predetermined number (typically about $10^5$) of erase/write cycles and, as a result, limits the operational life of the memory device.

Thus, there is a need for a noble memory cell device that combines the advantages of DRAM and flash memory. In other words, there is a need for a semiconductor memory device having memory cells that allow scalable memory charge relative to cell density of the device with long-term retention, low voltage, high speed, and highly reliable operational characteristics. One such noble memory cell, which can be named as a Scalable Two-Transistor Memory cell, has been proposed by Nakazato et al. (refer to IEDM 97, pp. 179–182 and U.S. Pat. No. 5,952,692). Nakazato et al. referred to their device as a Planar Localized Electron Device Memory (PLEDM) cell. This memory cell has non-volatile, high-speed, very low-power dissipation, and high cell density characteristics. It also has an isolated memory node, which provides immunity against soft errors, a gain property, which provides a large S/N ratio. It is a quantum tunneling device working at room temperature with no hot carrier degradation effects, and can be fabricated by existing silicon processing technology.

Figure 1:
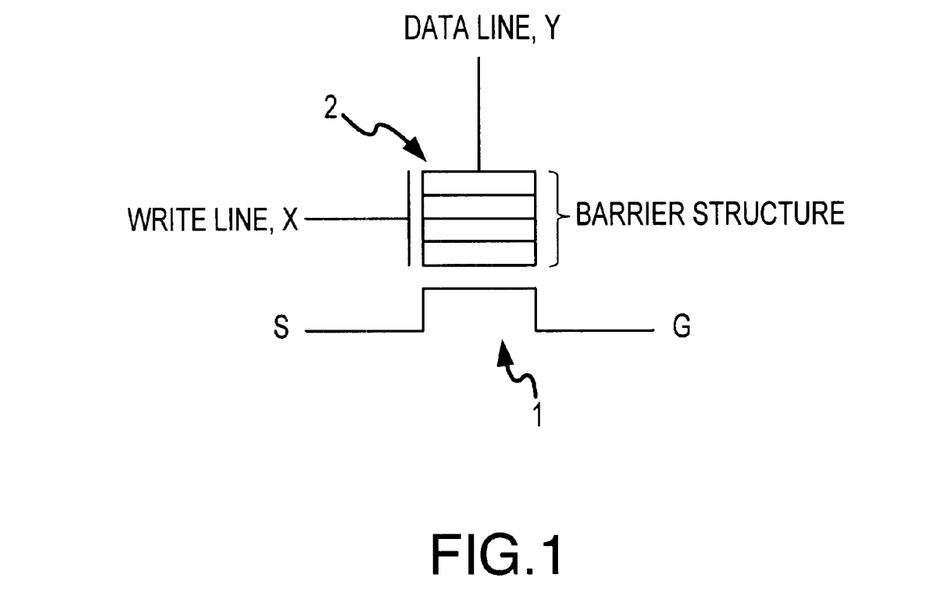
FIG. 1 is a schematic diagram of a typical STTM cell.

FIG. 1 is a schematic diagram of a typical Scalable Two-Transistor Memory (here after referred to as STTM) cell. The STTM cell comprises a sensing transistor (1), which is also known as a read or an access transistor; and a programming transistor (2), which is also known as a write transistor. The sensing transistor is basically a conventional MOS transistor consisting of a floating gate (also acting as a storage node of the memory cell), a drain (acting as a sense line, S, corresponding to a bit line) and a source (acting as a ground line, G, at a ground or a certain potential). The programming transistor includes a multiple tunnel junction (MTJ) barrier structure, which is stacked on the storage node of the sensing transistor, with a control gate formed over the sidewalls of the barrier structure and the storage node, acting as a control gate line X (which is also known as the write line), and a source region which is electrically connected to the top region of the barrier structure acting as a data line Y. The storage node also acts as the drain region of the programming transistor. The programming transistor is basically a vertical channel transistor placed on top of a conventional floating gate MOS sensing transistor.

In the write mode, a data voltage is applied to the data line Y, and a write voltage (i.e., program voltage) is applied to the write (control gate) line X. Therefore, barrier height between the data line Y and the storage node is reduced, and tunneling current flows through the insulating layer. As a result, charges (electrons or holes) may be stored in the storage node. These stored charges change the threshold voltage of the sensing transistor. For example, in the event that the electrons are stored in the storage node and the sensing transistor is an NMOS transistor, the threshold voltage of the sensing transistor is increased towards the positive voltage. In a STTM cell, the write operation can be achieved with a low write voltage, as compared to the flash memory device. This is because in a STTM cell, the charge flow into the storage node is controlled by write (control gate) line X as well as the data line Y.

In order to read (sense) the data stored in a STTM cell, a read voltage is applied to the write (control gate) line X and an appropriate voltage is applied to the ground line G. Next, a sense amplifier (not shown) detects the current that flows through the sense line S. In this case, in the event that the threshold voltage of the sensing transistor is higher than the read voltage, the sense line current may not flow. If, however, the threshold voltage of the sensing transistor is lower than the read voltage, the sense line current may flow.

In the above STTM cell, the storage node is completely surrounded by insulating material (i.e., completely floated) unlike the storage node of a DRAM cell. Thus, in the event that the write voltage is much higher than the read voltage, there is no need to refresh the memory cells. Alternatively, the write (control gate) line can be separated into two write lines with the sensing transistor controlled by a first write line and the programming transistor controlled by a second write line. In this case, even though the write voltage approximates the read voltage, the programming transistor is not turned on during the read operation. Accordingly, it is not required to refresh the memory cell regardless of the difference between the write voltage and the read voltage.

As explained above, a unit STTM cell is operated by three control lines; the write (control gate) line, the bit line and the data line; whereas the unit DRAM cell is operated by only two control lines—the write line and the bit line. Thus, there continues to be a need for compact layout of the cell array region, data line extensions, and bit line extensions, in order to increase the integration density of STTM devices. Also, there continues to be a need for noble column addressing schemes to the bit lines and data lines in a limited cell pitch.

The present invention is directed to a processing sequence required for making a STTM cell array with a unit cell area as low as $4F^2$, where F is a minimum feature size, that corresponds to the width of the data line or write line and also the spacing between the data lines or the write lines. The processing sequence and conditions are designed to offer wide flexibility in terms of material choices and layer thickness at different regions of the STTM cell with surface planarity maintained at several stages of the manufacturing sequence. The processing sequence is designed for making both memory cell and peripheral devices simultaneously, to save the total processing time.

SUMMARY OF THE INVENTION

According to a feature of a preferred embodiment of the present invention, there is provided a self-aligned processing sequence for making a Scalable Two-Transistor Memory (STTM) cell array with a minimum unit cell area of $4F^2$, where F represents the minimum feature size and also the width (and also the spacing) of the data lines or the write (control gate) lines. An STTM cell consists of a sensing (bottom) transistor and a programming (top) transistor. The programming (top) transistor has a multiple tunnel junction (MTJ) barrier structure on the floating gate of a sensing MOS transistor. According to a preferred embodiment of the present invention, the method of the present invention provides processing sequence and processing conditions for fabricating a memory cell array that are designed to offer a wide flexibility in terms of material choices and layer thickness at different regions of the STTM cell with surface planarity maintained at several stages of the manufacturing sequence in order to improve the device yield.

In the present invention, the entire or part of the large band gap insulator layer of the MTJ barrier structure may be formed using chemical vapor deposition (CVD) technique which allows a wide choice of materials such as silicon nitride, silicon oxide, silicon oxy-nitride, metal oxides, metal nitrides, etc. as possible insulator layer materials. The double sidewall gate insulating layer of the programming (top) transistor may contain multi-layered dielectric materials with layers deposited entirely by CVD or a combination of layers formed by thermal treatment and CVD.

As mentioned above, a feature of an embodiment of the present invention is to provide a smooth surface topology (planarity) at several stages of the processing sequence in order to improve the device's processing yield. In a preferred embodiment, additional metal, metal silicide or polycide layers are formed on top of the silicon layers to minimize the resistance of sense lines (bit lines) and data lines.

In the present invention, the processing of memory cell devices is made compatible with periphery devices so that the devices in both areas can be made simultaneously, thereby decreasing the total number of processing steps and, hence, lowering the manufacturing cost. Forming of isolation trenches around the devices, filling of the trenches with oxide insulator, forming of the source/drain and the gate regions of the peripheral devices are done simultaneously with the corresponding regions of the memory cell devices.

These and other features of the present invention are realized by the present invention wherein according to a preferred embodiment, there is provided a method of manufacturing a scalable two-transistor memory (STTM) cell array having three control lines including bit lines, data lines and word lines, each memory cell having a bottom transistor and a top transistor in a stacked configuration, comprising the steps of:

providing a substrate having an x-axis and a y-axis;

depositing a first gate dielectric layer on the substrate;

depositing a first conductive layer on the first gate dielectric layer to form a storage node;

depositing alternating layers of a low band gap semiconductor layer and a large band gap insulator layer to form a multiple tunnel junction barrier on the storage node layer;

depositing a second conductive layer to form a source layer of the top transistor;

etching the second conductive layer, multiple tunnel junction layer, the first conductive layer and the first gate dielectric layer into the substrate to form a plurality of island-type trench isolation regions using a photolithographic process;

depositing a first insulating layer over the substrate to fill the trench regions;

depositing a third conductive layer over the first insulating layer to form data lines;

etching the third conductive layer, the second conductive layer, multiple tunnel junction layer, the first conductive layer and the first gate dielectric layer until the substrate surface is exposed, to form grooves in a direction parallel with the y-axis in between the island-type filled trench isolation regions;

implanting impurities in the exposed substrate to form the source/drain extension regions of the bottom transistor in the grooves formed in a direction parallel with the y-axis using a photolithographic process;

forming bit lines in the grooves formed in a direction parallel with the y-axis;

depositing a second insulating layer over the cell array and etched grooves in a direction parallel with the y-axis;

forming a photoresist pattern defining control gate lines over the second insulating layer;

performing an etching process to etch away the second insulating layer between and on top of adjacent memory cells in a direction parallel with the x-axis;

removing the photoresist pattern;

depositing second gate dielectric layers on the sidewalls of the multiple tunnel junction barrier structure;

depositing fourth conductive layer over the entire surface of the array; and forming the word lines by chemical mechanical polishing (CMP) or etching of the fourth conductive layer.

According to other features of the present invention, the substrate material is selected from the group consisting of silicon, silicon germanium, silicon germanium on silicon, silicon germanium carbide on silicon, and silicon on insulator (SOI). The first gate dielectric layer is a silicon oxide layer of thickness between about 15–100 angstroms. The first conductive layer is a doped semiconductor storage node layer having a thickness of up to 5,000 angstroms. The second conductive layer forming the source layer of the top transistor is also a doped semiconductor layer having a thickness of up to 5000 angstroms. Both the storage node and the source layer of the top transistor are made of a material selected from the group consisting of silicon, germanium, silicon germanium, and silicon germanium carbide. The multiple tunnel junction (MTJ) barrier on the storage node is made of 2–20 alternating layers of low band gap (<2 eV) semiconductor layers of thickness up to 1,000 angstroms and large band gap (<10 eV) insulator layers of thickness up to 100 angstroms. Material used for the low band gap semiconductor layers forming the MTJ barrier is selected from the group consisting of either undoped or doped silicon, germanium, silicon germanium, and silicon germanium carbide. The low band gap semiconductor layers forming the MTJ barrier are deposited on the storage node layer under a temperature range where the as-deposited semiconductor layer is in an amorphous phase or in a polycrystalline phase. Typical temperature range used to deposit low band gap semiconductor layers of the MTJ barrier is 300–900 degrees centigrade. Material used for the large band gap insulator layers forming the MTJ barrier is selected from the group consisting of silicon oxide, silicon nitride, silicon oxynitride, metal oxides (like $HfO_x$, $ZrO_x$, $Al_2O_3$) and metal nitrides (like AlN).

According to another feature of an embodiment of the present invention, a chemical mechanical polishing (CMP) stopping layer is deposited on the second conductive layer, which is the source layer of the programming (top) transistor. Typical CMP stopping layer material is SiN.

According to another feature of an embodiment of the present invention in order to obtain plurality of trench isolation regions between the memory cells in the y-axis direction, the CMP stopping layer is etched first to form a CMP stopping layer pattern. The CMP stopping layer pattern acts as an etch mask while etching the second conductive layer, the MTJ layer, the first conductive layer, the first gate dielectric layer and the substrate to form a plurality of trench regions. The trench regions are then filled with the first insulating layer, which is a material such as silicon oxide. The substrate, with the MTJ layer and other active layers on top of it, is then subjected to CMP to achieve a smooth surface across the substrate. The CMP stopping layer is then removed and the third conductive layer is formed over the first insulating layer and the second conductive layer. The third conductive layer material is selected from the group consisting of a heavily doped polysilicon, polycide and metals.

According to another feature of an embodiment of the present invention an optional cleaning process may be performed as needed to remove a native oxide layer on the second conductive (doped semiconductor) layer pattern before depositing the third conductive layer.

According to another feature of an embodiment of the present invention, a capping layer is deposited over the third conductive layer. The material used for the capping layer typically is SiN. By using a photolithographic process the capping layer and then the third conductive layer, the second conductive layer, the MTJ layer, the first conductive layer, and the first gate dielectric layer are sequentially etched until the substrate surface is exposed, to form grooves in a direction parallel with y-axis in between the island type filled trench isolation regions. The second conductive layer and the layers under it are dry etched using the capping layer as an etch mask. This results in a self-aligned etching process.

According to another feature of an embodiment of the present invention, the bottom layer of the top transistor (or second) gate dielectric layers is formed before implanting impurities in the exposed substrate to form the source/drain extension regions of the bottom transistor. The bottom layer of the second gate dielectric layers is formed by a thermal oxide or a multiple insulator combination including the thermal oxide. Formation of the bottom layer of the second gate dielectric layers using a thermal oxidation step cures damage caused by dry etching to the MTJ barrier layer sidewall and to the substrate surface between the data lines.

According to another feature of an embodiment of the present invention, a sidewall spacer is formed on the sidewall surface of the memory cell in the grooves formed in a direction parallel with y-axis after the source/drain extension regions of the bottom transistor are formed. The sidewall spacer is formed of an oxide layer or a nitride layer. After the sidewall spacers are formed, the substrate is subjected to a heavy dose of ion implantation to form a heavily doped section within the source/drain extension regions of the bottom transistor. These heavily doped sections within the source/drain extension regions may create a metallization effect forming the bit lines. In an alternate way, to form bit lines, a heavily doped polysilicon or a salicidation or a polycide or a metal deposition step is performed on the heavily doped sections within the source/drain extension regions of the bottom transistor. The sidewall spacers are removed after forming the bit lines. According to another feature of an embodiment of the present invention, the sidewall spacers are removed before depositing the top layer of the second gate dielectric layers on the sidewalls of the MTJ barrier structure.

According to yet another feature of an embodiment of the present invention, a conformal etch stop layer is formed on the entire surface of the memory cell array after forming the bit lines, but before depositing the second insulating layer over the cell array. The material used for the conformal etch stop layer is SiON or SiN. Material used to form the second insulating layer on the conformal etch stop layer to fill the etched grooves in a direction parallel with the y-axis is typically a CVD oxide. After depositing the second insulating layer a CMP process is performed in order to planarize the entire memory cell array surface. After etching the second insulating layer formed in the grooves in between the memory cells and on top of the memory cells, in a direction parallel with the x-axis, the conformal etch stop layer between adjacent memory cells in a direction parallel with the x-axis is etched until the portions of the bit lines underneath are exposed. The etching processes used in this invention are either dry and/or wet etching. A CVD oxide or a CVD nitride layer is deposited over the entire surface of the array to cover the exposed bit line regions and to form a top layer of the second gate dielectric layers on the sidewalls of the top transistors of the memory cells.

According to another feature of an embodiment of the present invention, the top transistor (or second gate) dielectric layers are multi-layered insulators. These multi-layered insulators are a combination of thermally grown and deposited layers. The multi-layered insulators are selected from a group consisting of SiO, SiN, SiON, metal oxides and metal nitrides. After forming the second gate dielectric layers, the word lines are formed on them by depositing a fourth conductive layer which is a metal, polysilicon/metal or polysilicon/silicide damascene process. Typical material systems used to form word lines are Ti/W or TiN/silicide. After depositing the fourth conductive layer a CMP process is performed to planarize the entire surface of the memory array and to remove unwanted fourth conductive layer material until the word lines are formed.

According to another feature of an embodiment of the present invention, there is provided a method of manufacturing peripheral circuitry CMOS devices of a scalable two-transistor memory having a memory device array according to the present invention, comprising the steps of:

forming a gate dielectric layer, a first conductive layer, alternating layers of a multiple tunnel junction (MTJ) barrier, a second conductive layer, and a CMP stopping layer at the same time these layers are formed for the memory device array;

selectively removing the CMP stopping layer, the second conductive layer and the MTJ barrier layers all on top of the CMOS device areas and leaving the first conductive layer and the oxide layer underneath as part of the peripheral CMOS device gate structure;

forming source/drain regions of the peripheral CMOS devices; and forming a conductive layer on top of the peripheral CMOS device gate structure at the same time data lines of the memory cell array are formed.

The source/drain regions of the peripheral CMOS devices may be formed at the same time the corresponding regions of the sensing (bottom) transistors of the memory cell arrays are formed. Additionally, contacts to the source/drain regions of the peripheral CMOS device may also be formed at the same time contacts are made to the sensing (bottom) transistors of the memory cell array. Metals, highly doped polysilicon, polycide or salicide may be used to form contacts to the source/drain regions of the periphery devices. Material for the conductive gate layer of the periphery CMOS devices is selected from the group consisting of metals, doped poly-silicon, polysilicon/metal and polysilicon/silicide.

DETAILED DESCRIPTION OF THE INVENTION

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the present invention to those of ordinary skill in the art. In the drawings, the thickness of layers and regions are exaggerated for clarity. It will also be understood that when a layer is referred to as being on another layer or substrate, it can be directly on the other layer or substrate, and one or more intervening layers may also be present. Further, it will be understood that when a layer is referred to as being under another layer, it can be directly under, and one or more intervening layers may also be present.

In the present invention, the term planarity means a smooth surface without any peaks and valleys, and the term etching also includes ashing and stripping to the conventional wet or dry etching. The term heavy-doping means greater than $10^9 cm^{-3}$ doping concentration. Alternate terms used in the description of this invention, which are frequently used in the literature and generally well known to those of skilled in the art are given below for clarity of reference and meaning.

Control Gate Line: write line or word line

Bit Line: read line or sense line.

Sensing Transistor: Read Transistor, Access Transistor, or Bottom Transistor

Programming Transistor: Write Transistor or Top Transistor

In preferred embodiments of the present invention, the barrier structure of the STTM cell can be fabricated in a number of different ways. It may include a multiple tunnel junction (MTJ) structure made of alternating layers of a conductor and an insulator material. The conductor layer in the MTJ structure may be a semiconductor. In the MTJ structure, the semiconductor layers are generally relatively thicker and are made using a material having a lower energy band gap than the insulator material. The MTJ structure can be achieved by forming a stack of alternating poly-silicon and silicon nitride layers (U.S. Pat. No. 5,952,692). To obtain silicon nitride layers, thermal nitridation of deposited polysilicon layers in $NH_3$ ambient can be used (U.S. Pat. No. 5,952,692), but this process limits the maximum insulator thickness to about 30–40 angstroms. One of the features of the present invention is to design a process that allows for a wide range of choices for the material and thickness of the insulator layer in the MTJ structure.

Figure 2:
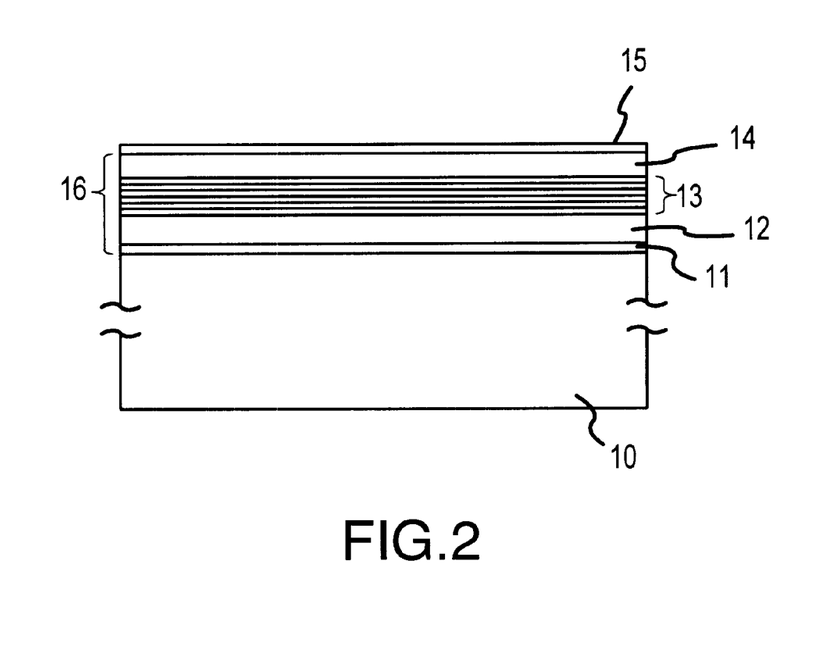
FIG. 2 is a cross-sectional representative diagram showing a stack of various insulator and semiconductor layers formed on a semiconductor substrate including the MTJ barrier according to an embodiment of the present invention.

Referring to FIG. 2, a first gate dielectric layer (11), a first conductive (which can be a doped semiconductor such as Si, Ge, SiGe, or SiGeC) layer (12), a multiple tunnel junction barrier structure layer (13), and a second conductive (which can be a doped semiconductor such as Si, Ge, SiGe, or SiGeC) layer (14) are sequentially formed on a semiconductor substrate (10). A CMP stopper layer (15) such as a silicon nitride layer is then formed on the second doped semiconductor layer (14). The semiconductor substrate material is selected from the group consisting of silicon, silicon germanium, silicon germanium on silicon, silicon germanium carbide on silicon, and silicon on insulator (SOI). The thickness of the first gate dielectric layer (11), which can be a silicon oxide layer, is between about 15–100 angstroms. The first conductive layer (12) acts as a storage node layer of the memory cell and also as a floating gate of the sensing (bottom) MOS transistor (1). The second conductive layer (14) acts as the source of the programming (top) transistor (2). The conductive layers (12 and 14) can be either doped poly-crystalline or doped amorphous Si, Ge, SiGe, or SiGeC. The crystallinity phase (amorphous or poly-crystalline) of the conductive layers (12 and 14) depends on the deposition temperature and the post-deposition temperatures the layers are subjected to during further processing. Thickness of the storage node layer (12) is up to about 5000 angstroms. The multiple tunnel junction (MTJ) barrier structure (13) is formed by alternately and sequentially depositing a low band-gap semiconductor layer and a large band-gap insulator layer. The total number of layers in the tunnel barrier structure (13) may be between 2 to 20. Each of the insulator layers of the MTJ structure (13) is preferably formed of a material having a barrier height less than about 10 eV, which is higher than that of the semiconductor layer (<2 eV). For example, the insulator layer of the MTJ structure 13 is preferably formed of a SiN layer, an SiON layer, an SiO layer, a metal oxide (e.g., aluminum oxide, hefnium oxide and zirconium oxide) layer, or a metal nitride (e.g., aluminum nitride) layer having a thickness of about 100 angstroms or less. Also, each of the semiconductor layers of the MTJ structure (13) is selected from the material group consisting of intrinsic, un-doped and doped Si, Ge, SiGe, SiGeC, having a thickness of about 1,000 angstroms or less. The silicon layer may be deposited at a temperature between about 300° C. to 900° C. That is to say, either amorphous silicon or poly-silicon may be allowed in the as-deposited state. In a case where the as-deposited semiconductor layer is in an amorphous phase, it may change to a poly-crystalline phase during later stages of the processing sequence. Thickness of the second conductive layer (14), which acts as the source region of the vertical, double-sided wall gate MTJ device (top transistor) is up to about 5000 angstroms. After the semiconductor and insulator is layers shown in FIG. 2 are grown, a first etch pattern is formed over the CMP stopping layer (15) using a photolithographic process to form field isolation regions in areas 21 as shown in FIG. 3(a).

Figure 3A:
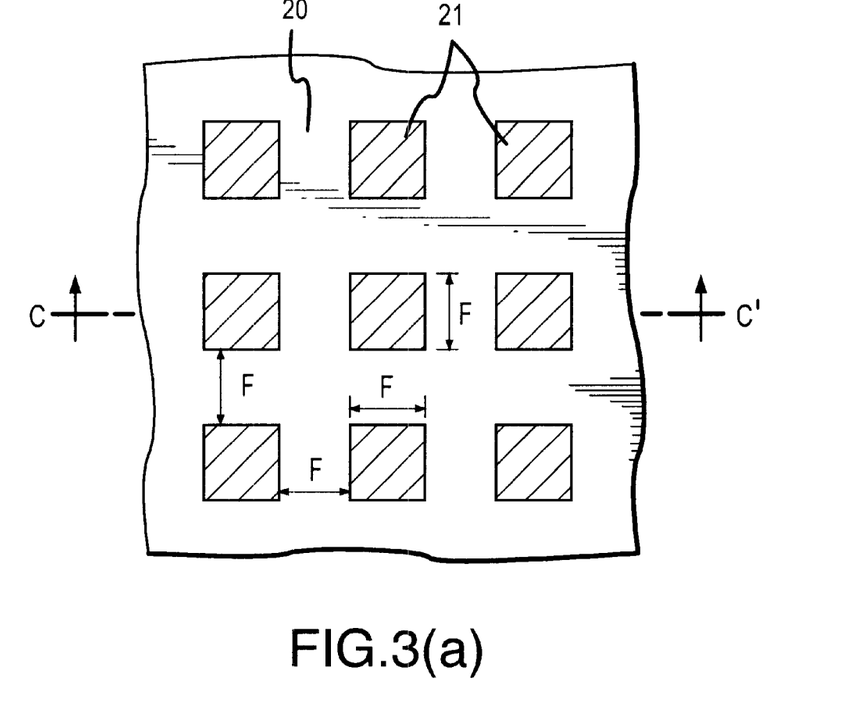
FIG. 3(a) is a partial, top view of a mesh pattern of a memory cell array according to an embodiment of the present invention, after isolation islands (21) have been formed by insulator (oxide) filled trenches.
Figure 3B:
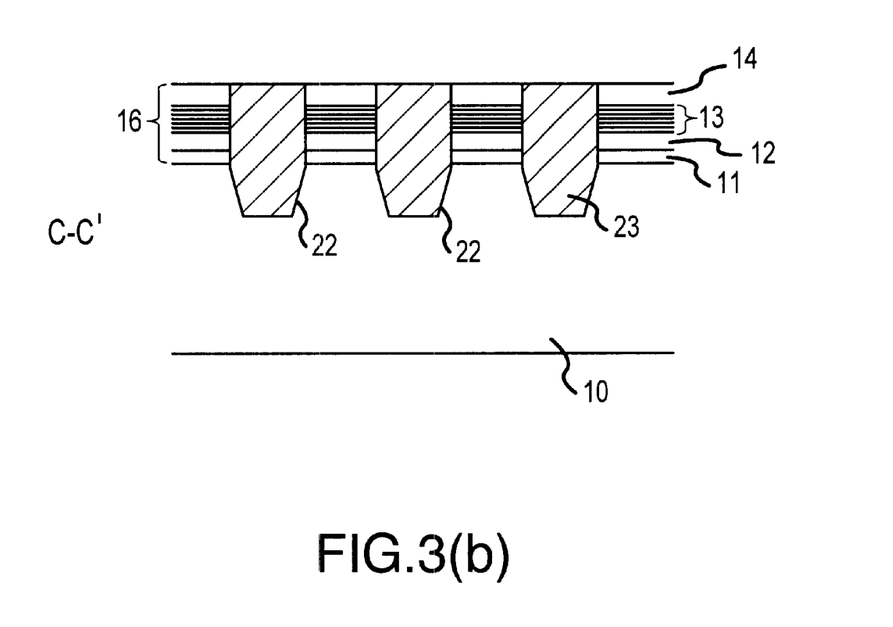
FIG. 3(b) is a cross-sectional view of the memory cell array taken along line C–C' of FIG. 3(a).

Referring to FIG. 3(a) and FIG. 3(b), the CMP stopper layer 15 (not shown in FIG. 3b), the second conductive layer (14), the MTJ barrier structure (13), the first conductive layer (12) and the first gate dielectric layer (11) of the stack of layers (16) formed on top of substrate (10) are successively etched in selective areas (21) to form an active region having a mesh pattern on the substrate having an x-axis along a horizontal direction and a y-axis along a vertical direction. Accordingly, the active region (20) of the mesh pattern comprises sequentially stacked layers of first gate dielectric layer pattern, a first conductive (doped semiconductor) layer pattern, a multiple tunnel junction (MTJ) pattern, a second conductive (doped semiconductor) layer pattern, and a CMP stopper pattern. Subsequently, the semiconductor substrate (10) is etched using the CMP stopper (15) on the active device area (20) as an etching mask, thereby forming a plurality of island-type trench isolation regions (21). Each of the trench regions (22) are later filled with a first insulating layer(23), made of a material such as silicon oxide, and then subjected to CMP to achieve a smooth surface topology across the wafer. The CMP stopper (15) is then removed by etching.

Reference to a x-axis and a y-axis in conjunction with a description of this invention is merely for establishing relative direction of various components of the present STTM memory cell array for purposes of ease of clarity and comprehension for the reader of this description and not for any other purpose. Reference to an x-axis and a y-axis in the description of this invention is not to be interpreted as meaning that the STTM of this invention actually requires any specific x-axis or y-axis relative to any specific physical position on the surface of the STTM, but instead is to be interpreted as providing only direction, relative configuration and guidance as to the various components of the STTM of the present invention. Accordingly, the reference to any x-axis or y-axis is meant to be interpreted in a directional sense only, i.e., horizontal versus vertical relative to a plane, and accordingly, the reference thereof in the specification and the claims should not be used to purposefully interpret the scope of the claims of the present invention as requiring a particular x-axis or y-axis.

Figure 4A:
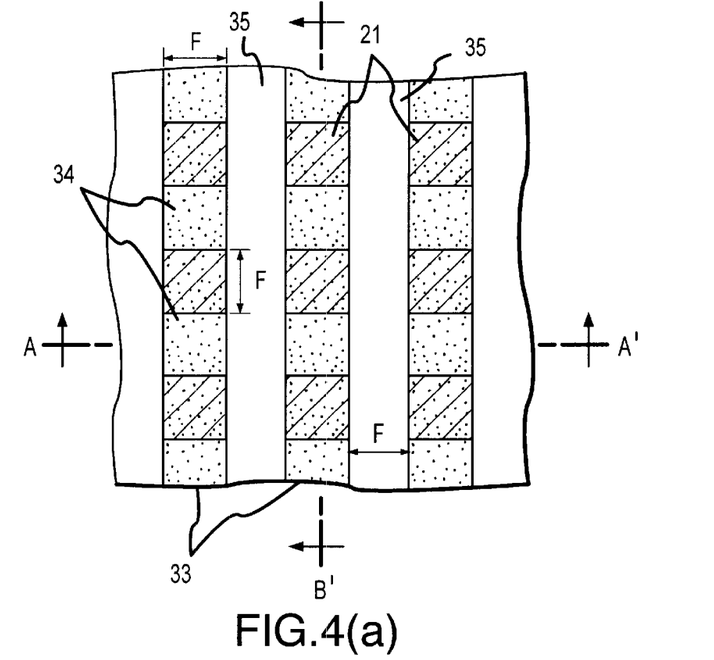
FIG. 4(a) is a partial, top view of a memory cell array according to an embodiment of the present invention, after data lines (33) have been formed.
Figure 4B:
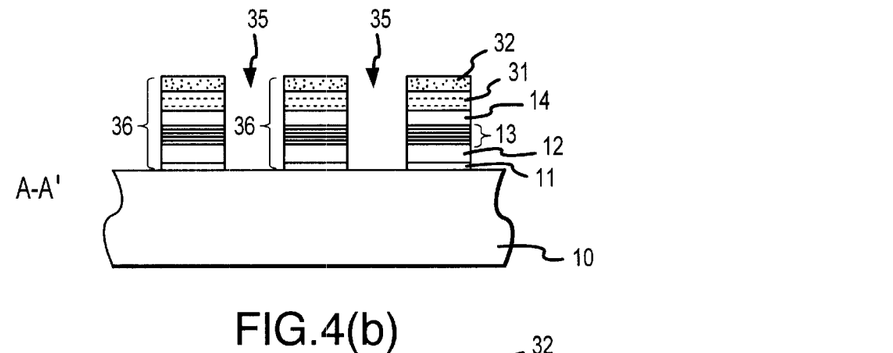
FIG. 4(b) is a cross-sectional view of the memory cell array taken along line A–A' of FIG. 4(a).
Figure 4C:
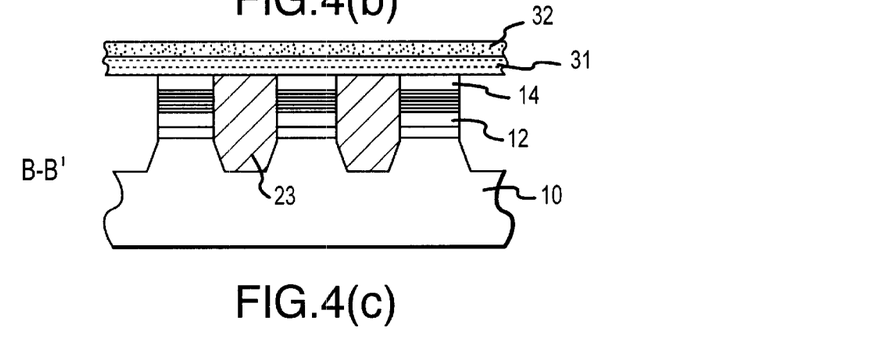
FIG. 4(c) is a cross-sectional view of the memory cell array taken along line B–B' of FIG. 4(a).

Referring to FIG. 4(a), FIG. 4(b) and FIG. 4(c), an optional cleaning process may be performed as needed to remove a native oxide layer on the second conductive (doped semiconductor) layer (14) pattern before initiating further processing. A third conductive layer (31) and a capping layer (32) are sequentially formed on the entire surface of the resultant structure. The third conductive layer (31) may be formed of a heavily doped polysilicon layer, a polycide layer or a metal layer; and, the capping layer (32) is preferably formed of a SiN layer. The third conductive layer (31) is intended to form the data lines (33) and make contacts to the source layer (14) of the programming (top) transistors (2). A second etch pattern is then formed over the third conductive layer/capping layer surface using a photo-lithographic process. The capping layer (32) and the third conductive layer (31) are then etched as shown in FIG. 4(a) to form a plurality of data lines (33), running over the isolation islands (21) and the active MTJ areas (34) located in-between the isolation islands, in a direction parallel with the Y-axis. The capping patterns (32) still remain on top of the data lines (33). The data lines (33) are parallel to each other and run parallel to the Y-axis. Subsequently, the vertical line regions (35), parallel with the Y-axis, between the data lines are etched by a self-aligned dry etching process, until the substrate (10) surface is exposed. This self-aligned etching process is made possible by the previously formed capping layer (32) pattern residing on top of the data lines. As a result of the above processing, multi-layered patterns (36) are formed under the data lines in a direction parallel with the y-axis, with the isolation islands (21) filled with a first insulating layer (23), made of a material such as silicon oxide, as shown in FIG. 4(c) between the data lines. At this stage of processing, the active multi-layered patterns (36) only have grooves (35) etched down to the surface of the substrate (10) on both sides in a direction parallel with the y-axis as shown in FIG. 4(a) and FIG. 4(b). Each of the active multi-layered patterns (36) includes a first gate dielectric layer (11) pattern, a storage node layer (12) pattern, a MTJ barrier stack (13) pattern, a source layer (14) pattern, and a source contact (data line contact) (31) pattern, and a capping layer (32) pattern, which are sequentially stacked from bottom to top in the above noted order. Each data line (33) is electrically connected to the plurality of source regions (14) of the programming (top) transistors (2) disposed under the data line (33).

Figure 5A:
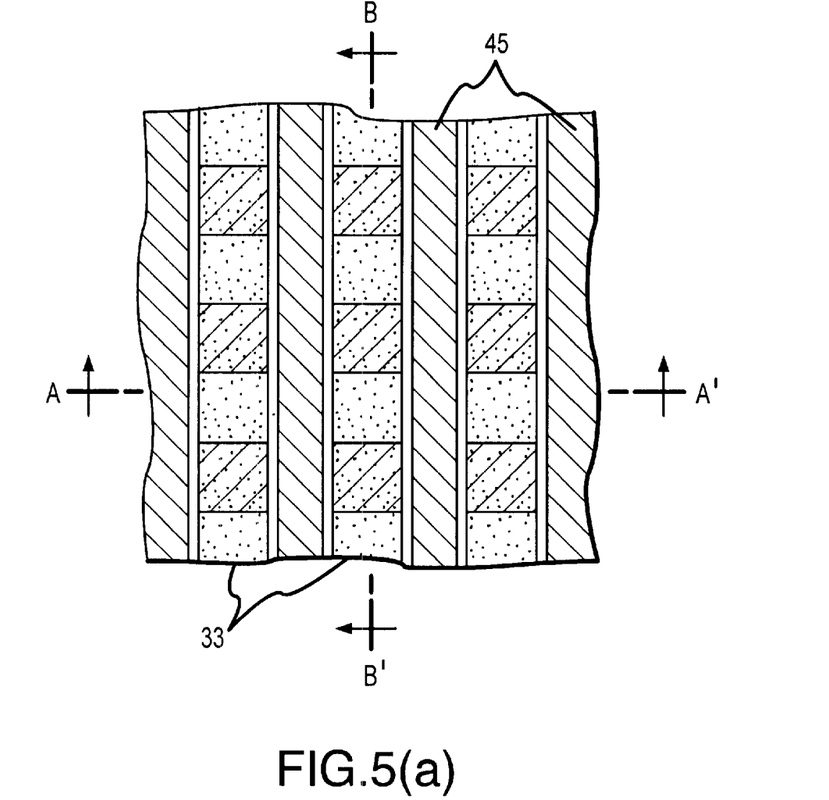
FIG. 5(a) is a partial, top view of a memory cell array according to an embodiment of the present invention, after bit lines (45) have been formed between data lines (33).
Figure 5B:
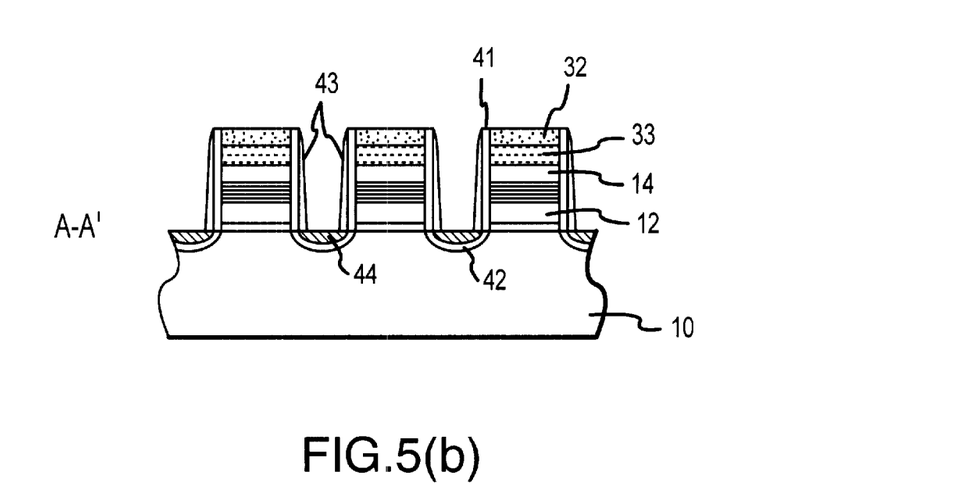
FIG. 5(b) is a cross-sectional view of the memory cell array taken along line A–A' of FIG. 5(a).

Referring to FIG. 5(a) and FIG. 5(b), an insulator layer (41) is formed on the sidewalls of the multi-layered patterns (36), at least to cover the sidewalls of the MTJ structure (13)

and the storage node (12). Thermal oxidation step is involved in the formation of this insulator layer (41). This thermal oxidation step helps to cure the dry etch damage to the sidewalls of the multi-layer pattern (36) and to the substrate (10) surface between the data lines. The insulator layer (41) acts as one of the (bottom) second gate dielectric layers of the programming (top) transistor (2). Later, another insulator layer (61) will be formed on top of this layer (41) to complete the programming (top) transistor gate dielectric layer arrangement. The insulator layer (41) is first formed over the entire surface of the wafer. This insulator layer is then patterned, by anisotropic etching, to form the double sidewall (second) gate dielectric (running in a direction parallel with the X-axis) of the multi-layered programming (top) transistor structures (36). The programming (top) transistor gate bottom dielectric layer (41) may be formed of a thermal oxide layer or a multi-layered insulator combination including the thermal oxide layer.

One of the features of this invention is to have a wide choice in terms of the materials and number of layers that can be used in forming the double sidewall gate dielectric of the vertical gate MTJ programming (top) transistor. The double side-wall programming (top) transistor gate dielectric (called as 'second gate dielectric') can be a single or a multiple layer material made of SiO, SiN, SiON, metal oxide (ex:AlO, HfO, ZrO etc.), metal silicates, and metal nitrides (ex: AlN). The multi-layered second gate dielectric may also contain a combination of layers formed by thermal treatment of the device and CVD.

After the formation of the double sidewall programming transistor gate insulator layer (41), source/drain extension regions (42) of the sensing (bottom) transistor are then formed into the substrate (10) surface regions. The source/drain extension regions (42) run continuously along the vertical lines 35 parallel with the Y-axis between the data lines (33). Before performing this implantation, these active regions may be optionally re-oxidized to remove any surface level material damaged by dry etching during the formation of multi-layered structures 36. Then spacers (43) are formed over the sidewalls of the MTJ stack (36).

The spacers may be formed of an insulator layer such as an oxide layer or a nitride layer. The spacers are formed first by depositing the insulator layer over the entire surface including the sidewalls and then anisotropically dry etching the layer on the horizontal surface areas down to the semiconductor substrate surface. After forming the spacers (43), heavy dose ion-implantation is performed to create heavily doped sections (44) inside the source/drain extension regions (42) created earlier between the data lines (33), thereby completing the formation of source/drain regions of the sensing (bottom) transistor (1). The source/drain regions running continuously along the vertical lines (35) parallel with the Y-axis constitute the bit lines (45). The heavy dose ion-implantation used to form heavily doped sections 44 inside the doped source/drain extension regions (42) will create a metallization effect, and therefore metallization of the bit lines is optional. Preferably, a metal (for example, W) or a metal silicide layer using a salicide (self-aligned silicide) technique or polycide, or heavily doped polysilicon is formed on the source/drain regions. Here, the source/drain regions including the metal silicide layer correspond to the sense (S) line and the ground (G) line and act as bit lines (45) of the memory cell array. The bit lines (45) run parallel with the Y-axis between the data lines (33). At this stage of processing, a cross-sectional view taken along line B–B' of FIG. 5(a) is the same as the cross-sectional view shown in FIG. 4(c). The self-aligned technology used in this invention allows closely spaced data lines and bit lines. Hence, a memory cell array with a unit cell area as low as $4F^2$, where F represents the minimum feature size, is made using the processing procedure described herein. The F also represents width of a data line or a control gate (write) line or the spacing between two adjacent data lines or control gate lines.

Figure 6A:
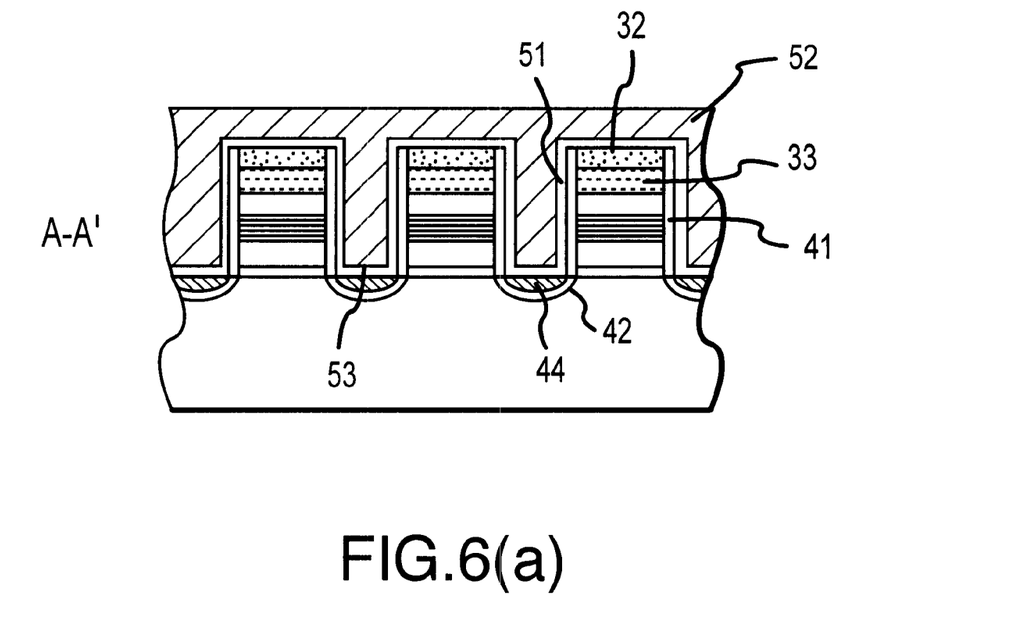
FIG. 6(a) is a cross-sectional view of the memory cell array taken along line A–A' of FIG. 5(a) after bit lines have been formed but before etching is carried out to form write lines.
Figure 6B:
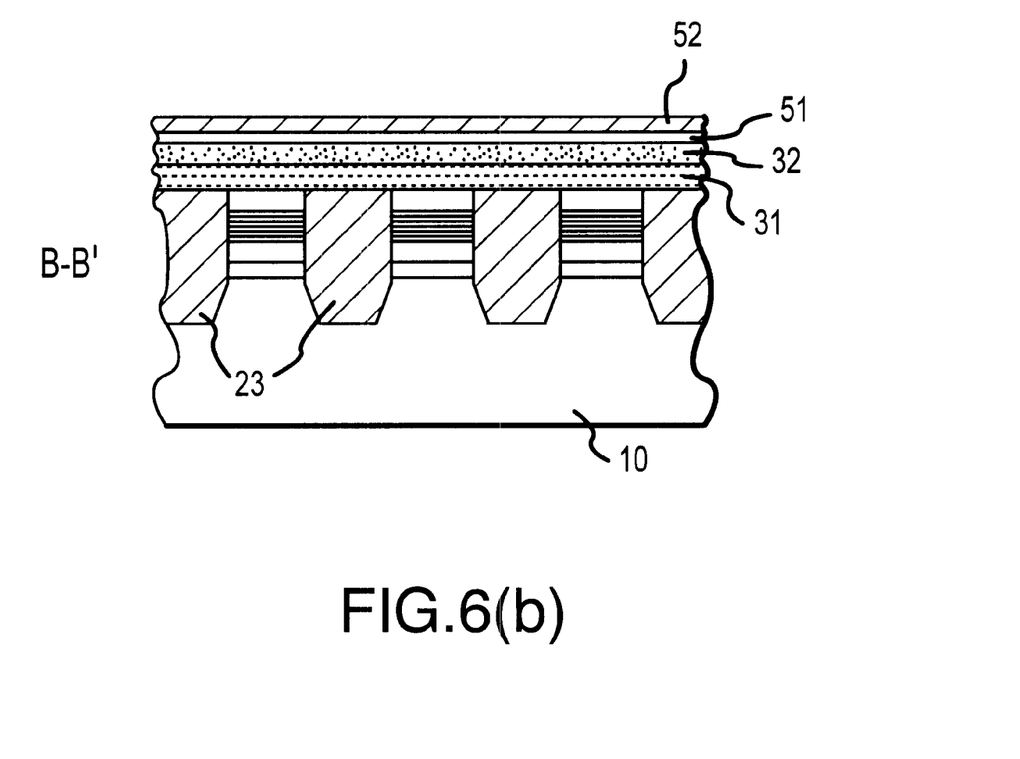
FIG. 6(b) is a cross-sectional view of the memory cell array taken along line B–B' of FIG. 5(a) after the bit lines have been formed but before etching is performed to form write lines.

Referring to FIG. 5(a), FIG. 5(b), FIG. 6(a), and FIG. 6(b), the spacers (43) are selectively removed as shown in FIG. 6(a). In one of the embodiments of the present invention, the spacers (43) are removed at a later stage. A conformal etch stop layer (51) such as a SiON layer or a SiN layer is formed on the entire surface of the above resultant structure. Subsequently, a second insulating layer (52), such as a CVD oxide layer, is deposited on the etch stop layer (51). The CVD oxide layer fills the grooves (53) running parallel with the y-axis and along the vertical lines (35) on top of the bit lines (45). These grooves (53) run between the data lines (33) adjacent to the active multi-layer structures 36. The second insulating layer (52) (CVD oxide layer) is planarized using a conventional method such as a CMP process. At the end of this process step, as shown in FIG. 6(a), the second insulator (52) not only fills the grooves (53) on top of the bit lines but also exists on top of the data lines (33).

Figure 7A:
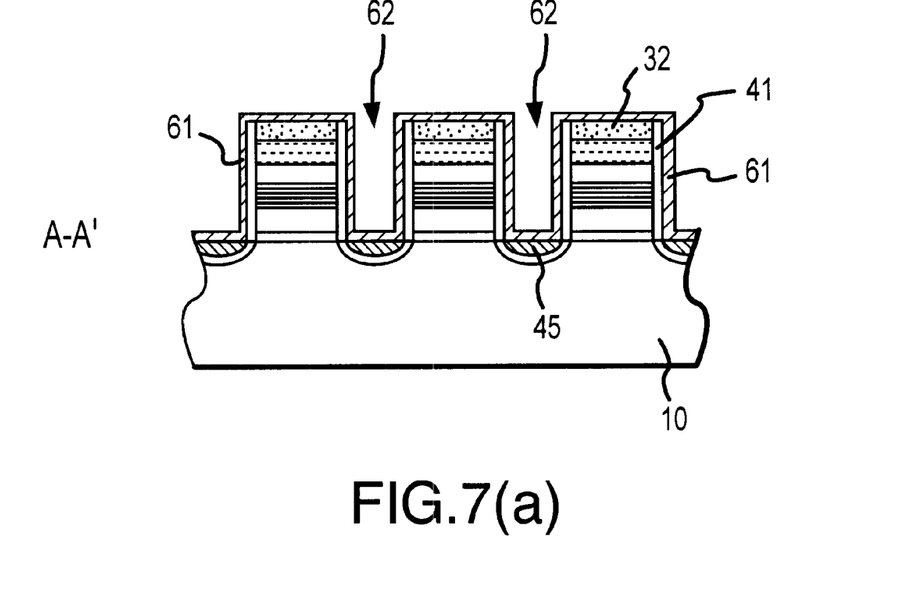
FIG. 7(a) is a cross-sectional view of a memory cell array according to an embodiment of the present invention taken along line A–A' of FIG. 5(a) before write (control gate) lines are formed.
Figure 7B:
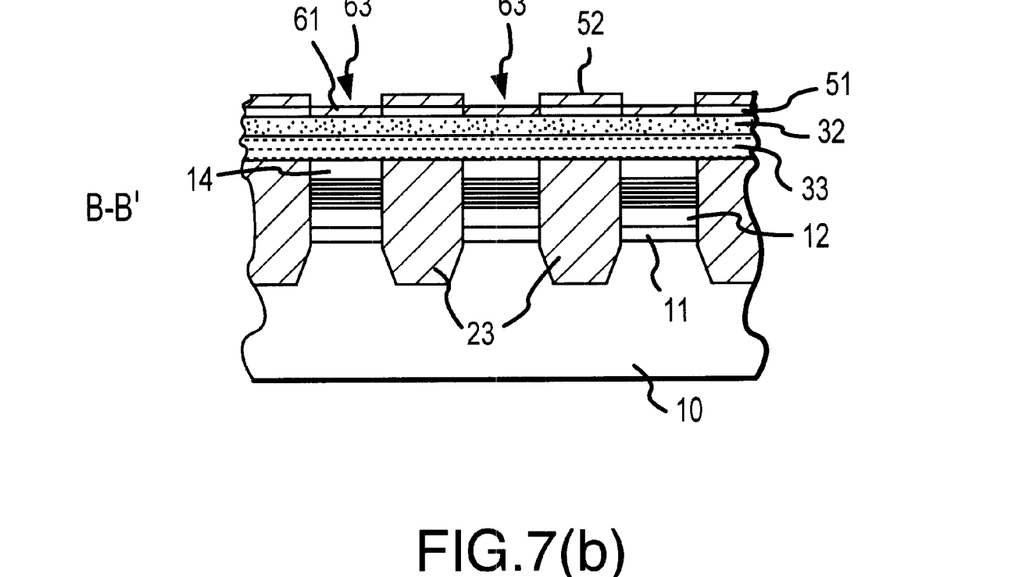
FIG. 7(b) is a cross-sectional view of the memory cell array taken along line B–B' of FIG. 5(a) before write (control gate) lines are formed.

Referring to FIG. 6(a), FIG. 6(b), FIG. 7(a), and FIG. 7(b), the second insulating (CVD oxide) layer (52) is etched using a third photoresist pattern to form a plurality of deep trenches (62) in the second insulating (CVD oxide) layer (52) running in a direction parallel with the X-axis in-between the multi-layer structures (36) on top of the bit lines (45), as shown in FIG. 7(a), and also to form shallow trenches (63) in the second insulator (CVD oxide) layer (52) on top of the multi-layer structures (36), as shown in FIG. 7(b). The second insulating (CVD oxide) layer (52) etching is performed until the etch stop layer (51) is exposed. These etched patterns are parallel to each other, run parallel to the X-axis and cross over the data lines (33) and bit lines (45). At the end of this process step, the regions on top of the bit lines (45), in-between the isolation regions (21) are also left with the second insulating (CVD oxide) layer (52), and the height of the oxide in these regions is in level with the height of adjacent isolation regions (21) in a direction parallel with the X-axis. After etching the second insulating (CVD oxide) layer (52), the etch stop layer (51) exposed by the etch patterns in a direction parallel with the x-axis is completely wet etched or partially wet etched following a dry etch. As mentioned earlier, in one of the embodiments of the present invention, the spacers (43) on the sidewalls of the multi-layer structures (36) may be removed at this stage of processing. As a result of the etch stop layer (51) etching process, portions of the bit lines (45) may be exposed by the deep trenches on top thereof.

Figure 8A:
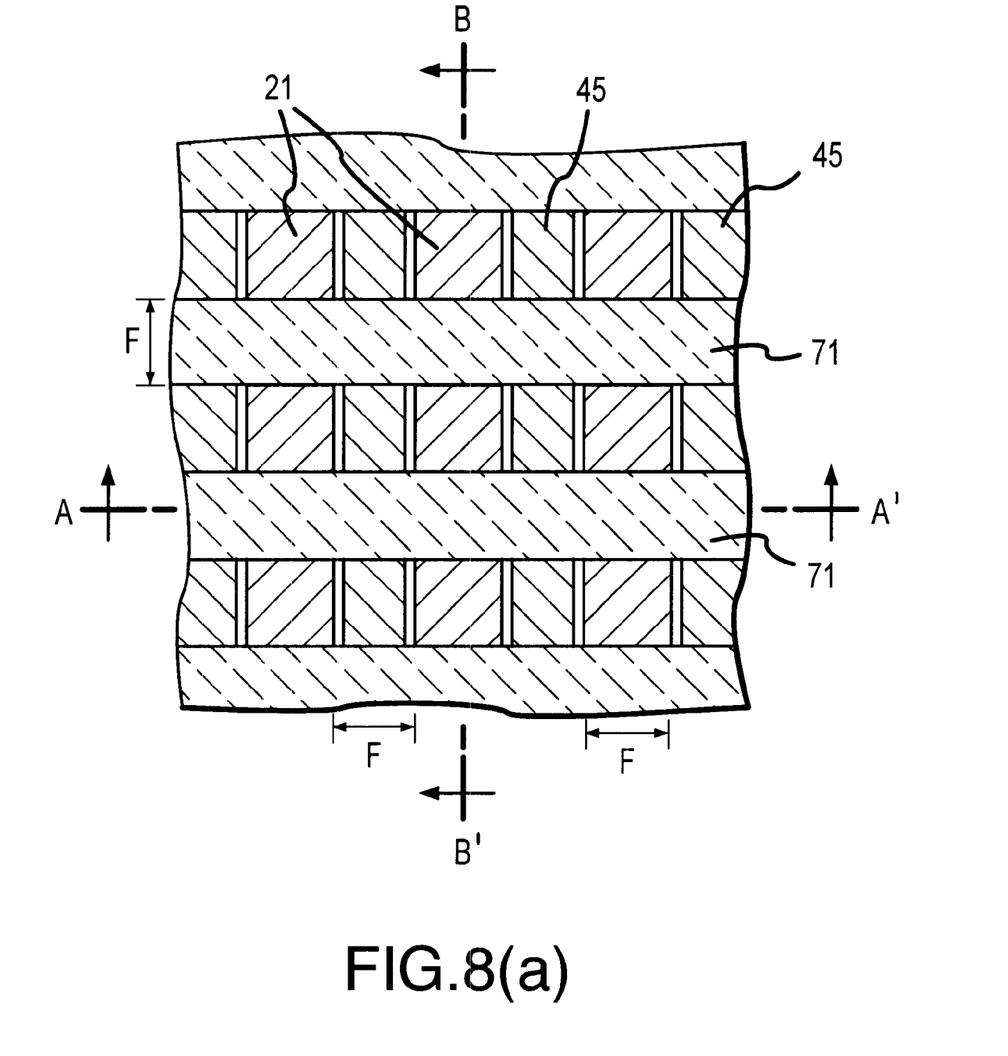
FIG. 8(a) is a partial, top view of a memory cell array according to an embodiment of the present invention after write (control gate) lines are formed.
Figure 8B:
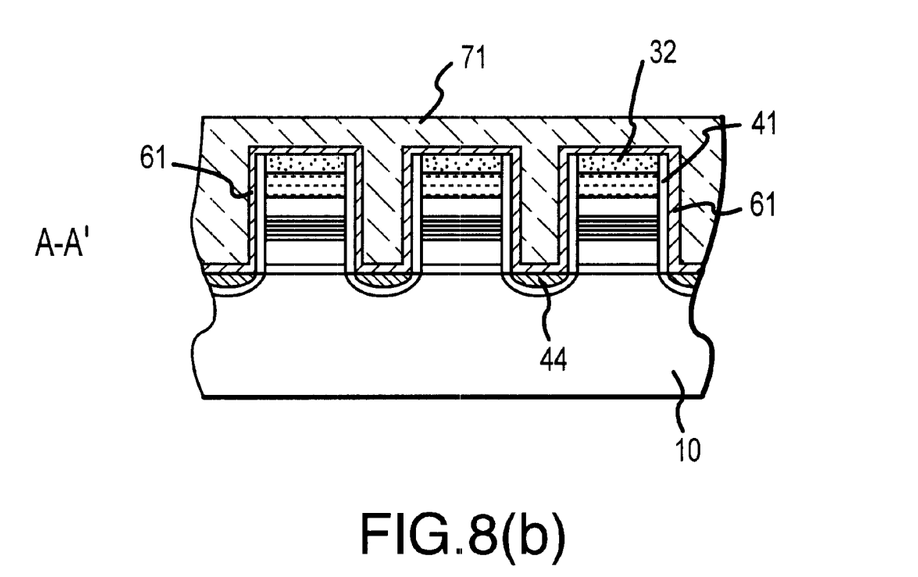
FIG. 8(b) is a cross-sectional view of the memory cell array taken along line A–A' of FIG. 8(a) after write (control gate) lines are formed.
Figure 8C:
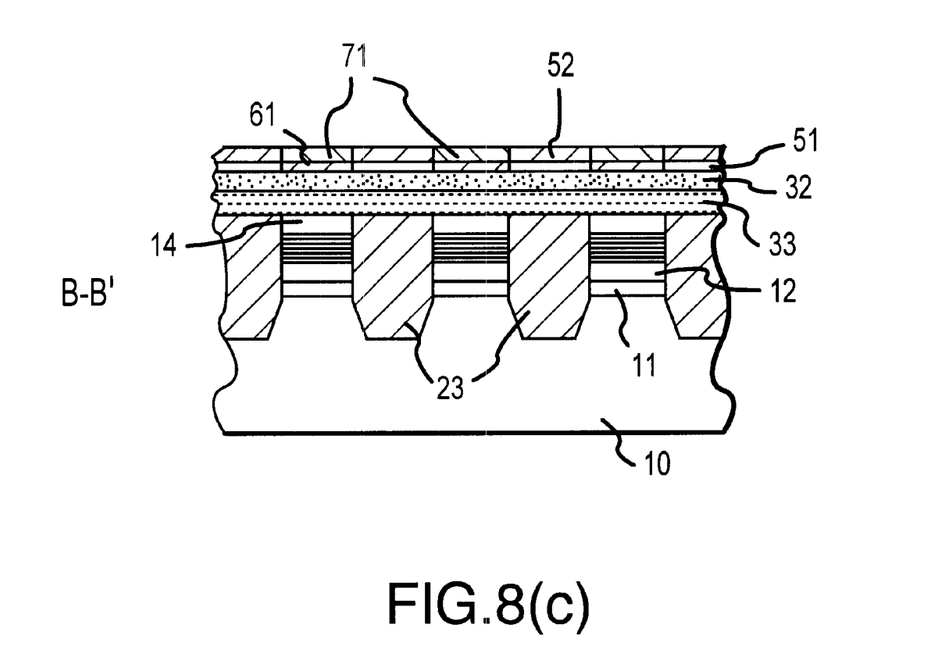
FIG. 8(c) is a cross-sectional view of the memory cell array taken along line B–B' of FIG. 8(a) after the write (control gate) lines are formed.

An insulating layer (61) such as a CVD oxide layer or a CVD nitride layer is formed on the above resultant structure in order to cover the exposed bit lines (45) and to complete the programming (top) transistor sidewall multi-layer gate dielectric layers arrangement. The insulating layer 61 is formed on top of the insulator layer (41), which is on the sidewalls of the multi-layer structures (36). The combination of these two insulator layers (41 and 61) forms and constitutes the gate dielectric layers arrangement of the programming (top) transistor. Combination of 41 and 61 is called the second gate dielectric layers to distinguish it from the sensing (bottom) transistor's gate dielectric layer, which is called the first gate dielectric layer. Referring to FIG. 8(a), FIG. 8(b) and FIG. 8(c), a plurality of continuous write lines (also referred to as word or control gate lines) (71) running in a direction parallel with the x-axis are then formed across and in the deep trenches (62) on top of bit lines (45) and in the shallow trenches (63) on top of the data lines (33) using a damascene process. The write (or word or control gate) lines are achieved by depositing a fourth conductive layer made of materials such as metals (for example TiN/W), metal/silicide (for example TiN/silicide), poly-silicon/metal, or poly-silicon/silicide on the entire surface followed by a CMP or etch back process until all unwanted conductive material on top of the oxide is removed. At the end of this processing step, the write (or word or control gate) lines are formed in a direction running parallel with the x-axis, over the double sidewalls and over the top of the active MTJ programming (top) transistor structures (36). The oxide isolation regions exist on both sides of the write lines in a direction running parallel with the Y-axis.

The above mentioned STTM cell array processing results in a planar surface and, hence, a high device processing yield. The self-aligned process described above also results in a closely packed STTM cell array, with a unit cell surface area as low as $4F^2$, where F is the minimum feature size. The F also represents width of a data line or a control gate (or write or word) line or the spacing between two adjacent data lines or control gate (or word or write) lines.

Figure 9A:
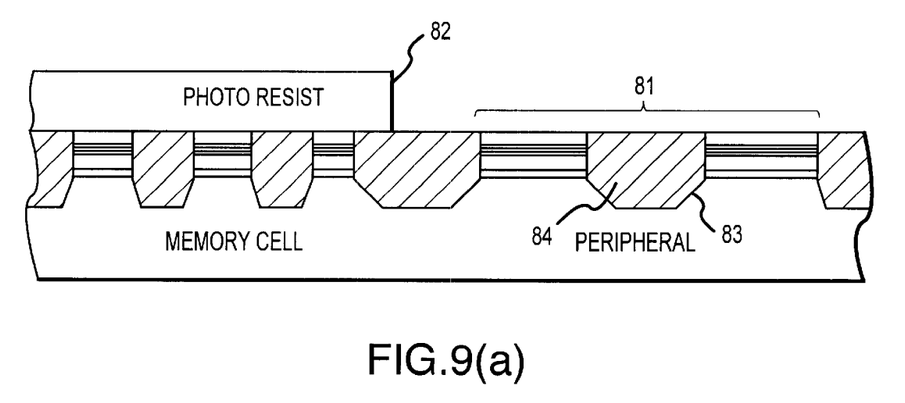
FIG. 9(a) is a partial, cross-sectional view of a memory cell array and nearby peripheral devices according to an embodiment of the present invention before dry etching the second doped semiconductor layer (14) and the MTJ stack (13).
Figure 9B:
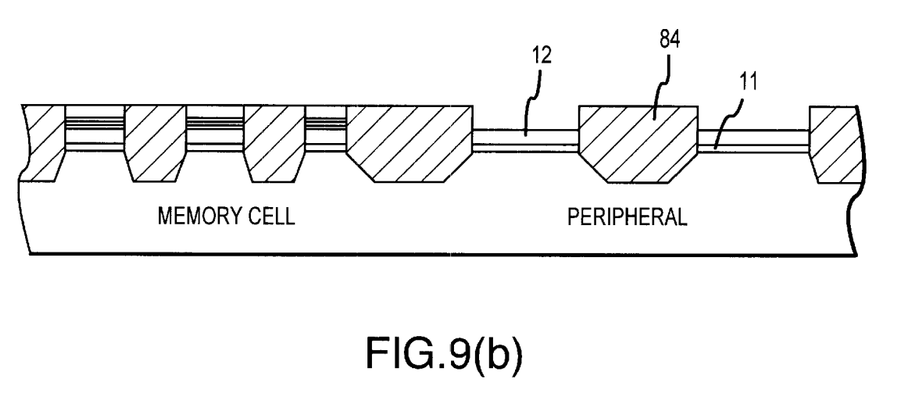
FIG. 9(b) is a partial, cross-sectional view of a memory cell array and nearby peripheral devices according to an embodiment of the present invention after dry etching the second doped semiconductor layer (14) and the MTJ stack (13).

FIG. 9(a) and FIG. 9(b) illustrate a method of forming CMOS circuits in the peripheral circuit region (81) at the same time the STTM cell array is being fabricated. Referring to FIG. 9(a), prior to formation of the third conductive layer (31) for the data line (33), a photoresist pattern (82) is formed on the entire structure after the CMP stopper (15) is removed. The photoresist pattern (82) covers the entire STTM cell array region exposing only the peripheral circuit region (81). Referring to FIG. 9(b), the second conductive (doped semiconductor) layer (14) patterns and the MTJ barrier structure (13) patterns in the peripheral region are selectively removed by dry etching to expose the first conductive (doped semiconductor) layer (12) in the peripheral region. The photoresist pattern (82) is then removed by ashing or stripping. Though not shown in the figures, the gate conductive material patterns of the peripheral region (81) devices are formed at the same time the third conductive layer (31) for the data lines (33) is deposited on the memory cell array region. Thus, gate patterns of the peripheral region (81) are simultaneously formed with the data lines. In addition, steps such as formation of the trenches (83) around the periphery devices, fill-up of these trenches with an oxide (84), creation of source/drain regions (not shown) by ion-implantation, are also carried out and conducted simultaneously with the corresponding or similar regions of the STTM cell array. The above outlined simultaneous processing of the memory cell and periphery area devices saves a significant amount of total device processing time. Materials used to form various regions of the peripheral circuitry CMOS devices are the same as those used for the corresponding regions of the STTM cell array devices. The materials used for different regions of the STTM cell array devices are already mentioned and described above and apply equally for the periphery area devices.

For optimum peripheral CMOS device performance, some of the regions of the peripheral devices may be formed independent of the STTM cell array devices. In this case, the list of materials used for forming various regions of the peripheral devices may differ from that of the STTM cell array devices. Optimization of the performance of peripheral CMOS devices may be drawn from the current state of the art and is intended to be included in the scope of the present invention.

Thus, a method of processing a STTM cell array and its periphery devices has been described according to the present invention. While the invention is susceptible to various modifications and alternative forms, specific embodiments have been shown by way of example in the drawings and described in detail herein. However, it should be understood that the invention is not limited to the particular processing conditions disclosed herein. Rather, the invention covers all modifications, equivalents, and alternatives falling within the spirit and scope of the invention as defined in the appended claims.

What is claimed is:

1. A method of manufacturing a scalable two-transistor memory cell array having three control lines including bit lines, data lines and word lines, each memory cell having a bottom transistor and a top transistor in a stacked configuration, comprising the steps of:

provi ding a substrate having an x-axis and a y-axis;

depositing a first gate dielectric layer on the substrate;

depositing a first conductive layer on the first gate dielectric layer to form a storage node layer;

depositing alternating layers of a low band gap semiconductor layer and a large band gap insulator layer to form a multiple tunnel junction barrier on the storage node layer;

depositing a second conductive layer to form a source layer of the top transistor;

etching the second conductive layer, the multiple tunnel junction layer, the first conductive layer and the first gate dielectric layer into the substrate to form a plurality of island-type trench isolation regions using a photolithographic process;

depositing a first insulating layer over the substrate to fill the trench regions;

depositing a third conductive layer over the first insulating layer and the second conductive layer to form data lines;

etching the third conductive layer, the second conductive layer, multiple tunnel junction layer, the first conductive layer and the first gate dielectric layer until the substrate surface is exposed, to form grooves in a direction parallel with y-axis in between the island-type filled trench isolation regions using a photolithographic process;

implanting impurities in the exposed substrate to form the source/drain extension regions of the bottom transistor in the grooves formed in a direction parallel with the y-axis;

forming bit lines in the grooves formed in a direction parallel with the y-axis;

depositing a second insulating layer over the cell array and etched grooves in a direction parallel with the y-axis;

forming a photoresist pattern defining control gate lines over the second insulating layer;

performing an etching process to etch away the second insulating layer between and on top of adjacent memory cells in a direction parallel with the x-axis;

removing the photoresist pattern;

depositing second gate dielectric layers on the sidewalls of the multiple tunnel junction barrier structure;

depositing fourth conductive layer over the entire surface of the array; and forming the word lines by chemical mechanical polishing (CMP) or etching of the fourth conductive layer.

2. A method of manufacturing a scalable two-transistor memory cell array as claimed in claim 1, wherein the substrate material is selected from the group consisting of silicon, silicon germanium, silicon germanium on silicon, silicon germanium carbide on silicon, and silicon on insulator (SOI).

3. A method of manufacturing a scalable two-transistor memory cell array as claimed in claim 1, wherein the first gate dielectric layer is a silicon oxide layer of thickness between about 15–100 angstroms.

4. A method of manufacturing a scalable two-transistor memory cell array as claimed in claim 1, wherein the first conductive layer is a doped semiconductor storage node layer having a thickness of up to 5,000 angstroms.

5. A method of manufacturing a scalable two-transistor memory cell array as claimed in claim 4, wherein the doped semiconductor storage node layer is made of a material selected from the group consisting of silicon, germanium, silicon germanium, and silicon germanium carbide.

6. A method of manufacturing a scalable two-transistor memory cell array as claimed in claim 1, wherein the number of alternating layers forming the multiple tunnel junction is between 2 to 20 layers.

7. A method of manufacturing a scalable two-transistor memory cell array as claimed in claim 1, wherein the low band gap semiconductor layers of the multiple tunnel junction barrier on the storage node have a thickness of up to 1,000 angstroms.

8. A method of manufacturing a scalable two-transistor memory cell array as claimed in claim 1, wherein the low band gap semiconductor layers forming the multiple tunnel junction barrier on the storage node have a band gap of less than about 2 eV.

9. A method of manufacturing a scalable two-transistor memory cell array as claimed in claim 1, wherein material of the low band gap semiconductor layers forming the multiple tunnel junction barrier on the storage node is selected from the group consisting of silicon, germanium, silicon germanium, and silicon germanium carbide.

10. A method of manufacturing a scalable two-transistor memory cell array as claimed in claim 1, wherein material of the low band gap semiconductor layers forming the multiple tunnel junction barrier on the storage node is either doped or undoped.

11. A method of manufacturing a scalable two-transistor memory cell array as claimed in claim 1, wherein the low band gap semiconductor layers forming the multiple tunnel junction barrier are deposited on the storage node under a temperature range where the as-deposited semiconductor layer is in an amorphous phase or in a polycrystalline phase.

12. A method of manufacturing a scalable two-transistor memory cell array as claimed in claim 11, wherein the temperature range is between about 300 to 900 degrees centigrade.

13. A method of manufacturing a scalable two-transistor memory cell array as claimed in claim 1, wherein the large band gap insulator layers forming the multiple tunnel junction barrier on the storage node have a thickness of up to 100 angstroms.

14. A method of manufacturing a scalable two-transistor memory cell array as claimed in claim 1, wherein the large band gap insulator layers forming the multiple tunnel junction barrier on the storage node have a band gap of less than 10 eV.

15. A method of manufacturing a scalable two-transistor memory cell array as claimed in claim 1, wherein material of the large band gap insulator layers forming the multiple tunnel junction barrier on the storage node is selected from the group consisting of silicon oxide, silicon nitride, silicon oxynitride, metal oxides and metal nitrides.

16. A method of manufacturing a scalable two transistor memory cell array as claimed in claim 15, wherein the metal oxides and metal nitrides include $HfO_x$, $ZrO_x$, $Al_2O_3$ and AlN.

17. A method of manufacturing a scalable two-transistor memory cell array as claimed in claim 1, wherein the second conductive layer forming the source layer of the top transistor is a doped semiconductor layer having a thickness of up to 5,000 angstroms.

18. A method of manufacturing a scalable two-transistor memory cell array as claimed in claim 17, wherein the material for doped semiconductor layer, forming the source layer of the top transistor, is selected from the group consisting of silicon, germanium, silicon germanium, and silicon germanium carbide.

19. A method of manufacturing a scalable two-transistor memory cell array as claimed in claim 1, wherein a chemical mechanical polishing (CMP) stopping layer is deposited on the second conductive layer, which forms the source layer of the top transistor.

20. A method of manufacturing a scalable two-transistor memory cell array as claimed in claim 19, wherein the chemical mechanical polishing (CMP) stopping layer is SiN.

21. A method of manufacturing a scalable two-transistor memory cell array as claimed in claim 19, wherein the CMP stopping layer is etched to form a CMP stopping layer pattern before etching the second conductive layer, the multiple tunnel junction layer, the first conductive layer, the gate dielectric layer and into the substrate to form a plurality of island-type trench isolation regions.

22. A method of manufacturing a scalable two-transistor memory cell array as claimed in claim 21, wherein the second conductive layer, the multiple tunnel junction layer, the first conductive layer, and the first gate dielectric layer are etched into the substrate by using the CMP stopping layer pattern as the etch mask to form a plurality of trench regions.

23. A method of manufacturing a scalable two-transistor memory cell array as claimed in claim 1, wherein the first insulating layer filling the trench regions is silicon dioxide.

24. A method of manufacturing a scalable two-transistor memory cell array as claimed in claim 22, wherein the CMP stopping layer is removed before depositing the third conductive layer over the first insulating layer and the second conductive layer.

25. A method of manufacturing a scalable two-transistor memory cell array as claimed in claim 1, wherein material for the third conductive layer is selected from the group consisting of a heavily doped polysilicon, polycide and metals.

26. A method of manufacturing a scalable two-transistor memory cell array as claimed in claim 1, wherein a capping layer is deposited over the third conductive layer.

27. A method of manufacturing a scalable two-transistor memory cell array as claimed in claim 26, wherein the capping layer material is SiN.

28. A method of manufacturing a scalable two-transistor memory cell array as claimed in claim 26, wherein the capping layer is etched before etching the third conductive layer, the second conductive layer, multiple tunnel junction layer, the first conductive layer and the first gate dielectric layer to form grooves in a direction parallel with y-axis in between the island-type filled trench isolation regions.

29. A method of manufacturing a scalable two-transistor memory cell array as claimed in claim 1, wherein the bottom layer of the top transistor (or second) gate dielectric layers is formed before implanting impurities in the exposed substrate to form the source/drain extension regions of the bottom transistor.

30. A method of manufacturing a scalable two-transistor memory cell array as claimed in claim 29, wherein material for the bottom layer of the second gate dielectric layers is a thermal oxide or a multiple-insulator combination including the thermal oxide.

31. A method of manufacturing a scalable two-transistor memory cell array as claimed in claim 29, wherein the formation of the bottom layer of the second gate dielectric layers involves a thermal oxidation step in order to cure any multiple tunnel junction barrier layer sidewall damage caused by etching during formation of the grooves in a direction parallel with y-axis.

32. A method of manufacturing a scalable two-transistor memory cell array as claimed in claim 29, wherein during the formation of the bottom layer of the second gate dielectric layers, the substrate surface between the data lines is oxidized to remove any damaged substrate surface layer caused by etching during formation of the grooves in a direction parallel with y-axis.

33. A method of manufacturing a scalable two-transistor memory cell array as claimed in claim 1, wherein a sidewall spacer is formed on the sidewall surface of the memory cell in the grooves formed in a direction parallel with y-axis after the source/drain extension regions of the bottom transistor are formed.

34. A method of manufacturing a scalable two-transistor memory cell array as claimed in claim 33, wherein the sidewall spacer is formed of an oxide layer or a nitride layer.

35. A method of manufacturing a scalable two-transistor memory cell array as claimed in claim 33, wherein the substrate is subjected to a heavy dose of ion implantation to form a heavily doped section within the source/drain extension regions of the bottom transistor.

36. A method of manufacturing a scalable two-transistor memory cell array as claimed in claim 35, wherein after forming the heavily doped sections within the source/drain extension regions of the bottom transistor, a heavily doped poly-silicon or a salicidation or a polycide or a metal deposition step is performed on the heavily doped sections, to form the bit lines.

37. A method of manufacturing a scalable two-transistor memory cell array as claimed in claim 35, wherein the heavily doped sections within the source/drain extension regions create a metallization effect forming the bit lines.

38. A method of manufacturing a scalable two-transistor memory cell array as claimed in claim 35, wherein the sidewall spacers are removed after forming the bit lines.

39. A method of manufacturing a scalable two-transistor memory cell array as claimed in claim 1, wherein a conformal etch stop layer is formed on the entire surface of the memory cell array after forming the bit lines, but before depositing the second insulating layer over the cell array.

40. A method of manufacturing a scalable two-transistor memory cell array as claimed in claim 39, wherein the etch stop layer is SiON or SiN.

41. A method of manufacturing a scalable two-transistor memory cell array as claimed in claim 39, wherein the second insulating layer deposited on the etch stop layer is a CVD oxide.

42. A method of manufacturing a scalable two-transistor memory cell array as claimed in claim 39, wherein a CMP process is performed after depositing the second insulator layer in order to planarize the entire memory cell array surface.

43. A method of manufacturing a scalable two-transistor memory cell array as claimed in claim 42, wherein after etching the second insulating layer in a direction parallel with the x-axis another etching process is performed to remove the etch stop layer between adjacent memory cells in a direction parallel with the x-axis until portions of the bit lines underneath are exposed.

44. A method of manufacturing a scalable two-transistor memory cell array as claimed in claim 43, wherein the etching processes are either dry and/or wet etching.

45. A method of manufacturing a scalable two-transistor memory cell array as claimed in claim 43, wherein a CVD oxide or CVD nitride layer is deposited over the entire surface of the array to cover the exposed bit line regions and to form a top layer of the second gate dielectric layers on the sidewalls of the top transistors of the memory cells.

46. A method of manufacturing a scalable two-transistor memory cell array as claimed in claim 1, wherein the top transistor (second) gate dielectric layers are multi-layered insulators.

47. A method of manufacturing a scalable two-transistor memory cell array as claimed in claim 46, wherein the multilayered insulators are a combination of thermally grown and deposited layers.

48. A method of manufacturing a scalable two-transistor memory cell array as claimed in claim 46, wherein materials for the multilayered insulators are selected from the group consisting of SiO, SiN, SiON, metal oxides and metal nitrides.

49. A method of manufacturing a scalable two-transistor memory cell array as claimed in claim 1, wherein the word lines are formed by a metal, polysilicon/metal or polysilicon/silicide damascene process.

50. A method of manufacturing a scalable two-transistor memory cell array as claimed in claim 1, wherein the word lines are formed by a TiN/W or TiN/silicide damascene process.

51. A method of manufacturing a scalable two-transistor memory cell array as claimed in claim 1, wherein the CMP process is performed to planarize the entire surface of the memory array and to remove unwanted fourth conductive layer material until the word lines are formed.

52. A method of manufacturing peripheral circuitry CMOS devices of a scalable two-transistor memory, comprising the steps of:
   forming a gate dielectric layer, a first conductive layer, alternating layers of a multiple tunnel junction (MTJ) barrier, a second conductive layer and a CMP stopping layer at the same time these layers are formed for a memory device array;
   selectively removing the CMP stopping layer, the second conductive layer and the MTJ barrier layers all on top of the peripheral CMOS device area leaving the first conductive layer and the gate dielectric layer;
   forming a conductive layer on an entire surface of the substrate where the CMP stopping layer, the second conductive layer and the MTJ barrier layers are selectively removed;
   patterning the conductive layer, the CMP stopping layer, the second conductive layer, the MTJ barrier layers and the first conductive layer to form data lines in the memory device array and a peripheral CMOS device gate structure in the peripheral CMOS device area; and
   forming source/drain regions of the peripheral CMOS device.

53. A method of manufacturing peripheral circuitry CMOS devices as claimed in claim 52, wherein the source/ drain regions of the periphery CMOS devices are formed at the same time the source/drain regions for bottom transistors of the memory cell array devices are formed.

54. A method of manufacturing peripheral circuitry CMOS devices as claimed in claim 52, wherein contacts to the source/drain regions of the periphery CMOS devices are formed at the same time contacts are made to bottom transistors of the memory cell array.

55. A method of manufacturing peripheral circuitry CMOS devices as claimed in claim 52, wherein metals, highly doped polysilicon, polycide or salicide are used to form contacts to the source/drain regions of the periphery devices.

56. A method of manufacturing peripheral circuitry CMOS devices as claimed in claim 52, wherein the conductive gate layer of the periphery CMOS devices is selected from the group consisting of metals, doped polysilicon, polysilicon/metal and polysilicon/silicide.

57. A method of manufacturing a scalable two-transistor memory cell array as claimed in claim 1, wherein a cleaning process is performed to remove a native oxide layer on the second conductive layer before depositing the third conductive layer.

58. A method of manufacturing a scalable two-transistor memory cell array as claimed in claim 28, wherein the second conductive layer, multiple tunnel junction layer, the first conductive layer and the first gate dielectric layers are etched by a self-aligned dry etching process until the substrate surface is exposed using the capping layer as etch mask.

59. A method of manufacturing a scalable two-transistor memory cell array as claimed in claim 1, wherein the unit cell in the memory cell array has an area between $4F^2$ and $8F^2$, where F represents a width of a data line or a control gate line or a spacing between two adjacent data lines or control gate lines or the minimum feature size.

60. A method of manufacturing a scalable two-transistor memory cell array as claimed in claim 55, wherein the unit cell in the memory cell array has an area between $4F^2$ and $6F^2$.

61. A method of manufacturing a scalable two-transistor memory cell array as claimed in claim 59, wherein the unit cell in the memory cell array has an area of $4F^2$.

* * * * *